US005273862A

United States Patent [19]
Zertani et al.

[11] Patent Number: 5,273,862
[45] Date of Patent: * Dec. 28, 1993

[54] PHOTOPOLYMERIZABLE RECORDING MATERIAL COMPRISING A COVER LAYER SUBSTANTIALLY IMPERMEABLE TO OXYGEN, BINDS OXYGEN AND IS SOLUBLE IN WATER AT 20°C.

[75] Inventors: Rudolf Zertani, Mainz-Bretzenheim; Dieter Mohr, Budenheim, both of Fed. Rep. of Germany

[73] Assignee: Hoechst Aktiengesellschaft, Frankfurt am Main, Fed. Rep. of Germany

[*] Notice: The portion of the term of this patent subsequent to Sep. 17, 2008 has been disclaimed.

[21] Appl. No.: 913,753

[22] Filed: Jul. 17, 1992

Related U.S. Application Data

[63] Continuation of Ser. No. 381,832, Jul. 19, 1989, abandoned.

[30] Foreign Application Priority Data

Jul. 29, 1988 [DE] Fed. Rep. of Germany ....... 3825836

[51] Int. Cl.$^5$ .................... G03F 7/11; G03F 7/031; G03C 1/77
[52] U.S. Cl. .................... 430/273; 430/271; 430/278; 430/281; 430/283; 430/284; 430/285; 430/288; 430/302; 430/906; 430/907; 430/908; 430/909; 430/910; 430/911; 430/916; 430/920
[58] Field of Search ............ 430/271, 273, 281, 285, 430/288, 283, 284, 907, 910, 909, 925, 906, 916, 911, 920, 278, 908, 302

[56] References Cited

U.S. PATENT DOCUMENTS

| | | | |
|---|---|---|---|
| 3,458,311 | 7/1969 | Alles | 96/35.1 |
| 3,753,715 | 8/1973 | Kluepfel et al. | 96/86 P |
| 4,072,527 | 2/1978 | Fan | 430/273 |
| 4,072,528 | 2/1978 | Bratt | 430/273 |
| 4,225,661 | 9/1980 | Muzyczko | 430/156 |
| 4,567,128 | 1/1986 | Bennett | 430/273 |
| 4,687,727 | 8/1987 | Toyama et al. | 430/281 |
| 4,816,303 | 3/1989 | Kroenke et al. | 428/333 |
| 4,826,753 | 5/1989 | Higashi et al. | 430/281 |
| 4,877,711 | 10/1989 | Aoai et al. | 430/281 |
| 4,920,036 | 4/1990 | Totsuka et al. | 430/281 |
| 4,988,607 | 1/1991 | Ali | 430/273 |
| 5,043,249 | 8/1991 | Rode et al. | 430/281 |
| 5,049,479 | 9/1991 | Zertani et al. | 430/281 |
| 5,114,832 | 5/1992 | Zertani et al. | 430/281 |

FOREIGN PATENT DOCUMENTS

| | | | |
|---|---|---|---|
| 287817 | 10/1988 | European Pat. Off. | 430/281 |
| 3432846 | 3/1985 | Fed. Rep. of Germany | |
| 60-186835 | 9/1985 | Japan | |

OTHER PUBLICATIONS

Chemical Abstracts 104:79266p p. 676.
Denisov et al., "Mechanisms of Action and Reactivities of the Free Radicals of Inhibitors," Chem. Rev., vol. 87, 1987, pp. 1313-1357.

Primary Examiner—Charles L. Bowers, Jr.
Assistant Examiner—John S. Chu
Attorney, Agent, or Firm—Foley & Lardner

[57] ABSTRACT

A photopolymerizable recording material is diclosed comprising a base material, a photopolymerizable layer and a cover layer which comprises a water-soluble polymer which is substantially impermeable to atmospheric oxygen, and a polymer which binds atmospheric oxygen and is virtually completely soluble in water at 20° C. The material displays reduced sensitivity to atmospheric oxygen, even on prolonged storage and at elevated ambient temperatures and elevated atmospheric humidity.

16 Claims, No Drawings

PHOTOPOLYMERIZABLE RECORDING MATERIAL COMPRISING A COVER LAYER SUBSTANTIALLY IMPERMEABLE TO OXYGEN, BINDS OXYGEN AND IS SOLUBLE IN WATER AT 20°C.

This application is a continuation of application Ser. No. 07/381,832, filed Jul. 19, 1989, now abandoned.

BACKGROUND OF THE INVENTION

The present invention relates to a photopolymerizable recording material comprising a base material, a photopolymerizable layer and a cover layer which is relatively impermeable to atmospheric oxygen. The material is suitable in particular for producing printing plates, in particular planographic printing plates.

Printing plates of the type mentioned are known for example from U.S. Pat. No. 3,458,311. The cover layers described therein consist of water-soluble polymers, for example polyvinyl alcohol, polyvinylpyrrolidone, gelatin or gum arabic. Of these substances, polyvinyl alcohol is preferred, since its barrier effect in respect of oxygen is very high. However, it has been found that stored photopolymerizable printing plates having a cover layer made of polyvinyl alcohol lose some of their light sensitivity in the course of weeks and months. It has also been observed that the protective effect strongly decreases with increasing temperature and increasing atmospheric humidity. It has indeed been possible to show that the oxygen permeability of polyvinyl alcohol strongly increases with temperature and atmospheric humidity. This disadvantage is particularly serious in the case of highly light-sensitive photopolymerizable mixtures containing photooxidizable substances and special synergistic initiator combinations. Such mixtures are described in earlier German Patent Applications P 37 10 279.6, P 37 10 281.8, P 37 10 282.6 and P 37 43 454.3.

It is also known to add to the photopolymerizable layer itself substances, for example tin salts or antioxidants, in order to trap the oxygen diffusing into the layer. Such additions are described, for example, in a paper by E. T. Denisov et al. in Chem. Rev. 1987, pp. 1313-1357. Since such compounds usually have undesirable side effects and in particular reduce the light sensitivity, they have not become established in practice.

SUMMARY OF THE INVENTION

Accordingly, it is an object of the present invention to provide a photopolymerizable recording material having an oxygen-barring cover layer whose light sensitivity does not decrease at all or only to about the same extent as in existing materials of this type.

Another object of the present invention is to provide a photopolymerizable recording material which displays improved storage stability at elevated temperatures and atmospheric humidities.

In accomplishing the foregoing objectives, there has been provided, in accordance with one aspect of the present invention, a photopolymerizable recording material which comprises a base material, a photopolymerizable layer and a cover layer comprising a water-soluble polymer which is substantially impermeable to oxygen, in particular atmospheric oxygen, and a polymer which binds oxygen and is soluble in water at 20° C.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

Suitable water-soluble polymers for binding atmospheric oxygen are in particular compounds having aliphatic amino groups which may be primary, secondary or tertiary. The polymers should preferably not contain any further functional groups in addition to the amino groups. Their molecular weights are in general within the range from about 300 to 1,000,000, preferably 1,000 to 200,000, in particular 10,000 to 200,000.

The amino-containing polymers used are preferably linear or branched polyalkyleneimines whose alkylene groups contain 2 to 8, in particular 2 to 4, carbon atoms. Of particular advantage are polyalkyleneimines, in particular polyethyleneimines and polypropyleneimines, having molecular weights of about 18,000 to 80,000.

The polyalkyleneimines can be prepared by acid-catalyzed polymerization of alkyleneimines, for example ethyleneimine or propyleneimine, as described in U.S. Pat. No. 2,223,930. Products having higher molecular weights can be obtained by reaction with bifunctional alkylating agents, for example 1,2-dichloroethane, and those having low molecular weights by addition of 1,2-ethylenediamine, as described in U.S. Pat. No. 3,519,687. Such polyalkyleneimines are commercial products. A preferred example contains about 30% of primary, 40% of secondary and 30% of tertiary amino groups.

The polymer which is substantially impermeable to atmospheric oxygen can be one of the polymers indicated in U.S. Pat. No. 3,458,311. Examples are in particular polyvinyl alcohol and partially hydrolyzed polyvinyl acetates, which may also contain vinyl ether and vinyl acetal units as long as the polymer remains water-soluble at 20° C. It is also possible to use gelatin, gum arabic, copolymers of alkyl vinyl ethers and maleic anhydride, polyvinylpyrrolidones and water-soluble high molecular weight polymers of ethylene oxide (M 100,000 to 3,000,000). Preference is given to those polymers whose oxygen permeability in a layer at 20° C. is less than 30, in particular less than 25, $cm^3/m^2/d/bar$.

The cover layer should transmit actinic light and in general has a thickness of about 0.5 to 10, preferably 1 to 4, $\mu m$. The cover layer preferably has a basis weight of about 0.5 to 10 $g/m^2$. It contains in general 3 to 60, preferably 5 to 40, % by weight of oxygen-binding polymer, in particular polyalkyleneimine, based on the total solids content. The cover layer is applied on top of the photopolymerizable layer in a conventional manner from aqueous solution or from a mixture of water and organic solvent. The coating solution may contain, for better wetting properties, up to about 10% by weight, preferably up to 5% by weight, of a surface-active agent, based on its solids content. The usable surface-active substances include the anionic, cationic and nonionic surface-active agents, for example sodium alkyl sulfates and alkylsulfonates of 12 to 18 carbon atoms such as sodium dodecyl sulfate, N-cetylbetaines, C-cetylbetaines, alkylaminocarboxylates, alkylaminodicarboxylates and polyethylene glycols having an average molecular weight of up to 400.

The cover layers of the material according to the invention have a lower oxygen permeability than existing cover layers, which contain only an oxygen-barring polymer, for example polyvinyl alcohol, with or without a wetting agent. The protective effect is improved in particular at elevated temperatures and at elevated atmospheric humidity and lasts longer on prolonged storage than that of existing protective layers. Since the high specific protective effect permits the use of relatively thin resolution is obtained. This property is in need of improvement in particular in the case of offset printing plates based on photopolymerizable materials.

The photopolymerizable layers of the recording materials according to the invention comprise a polymeric binder, a free-radical-polymerizable compound having at least one, preferably at least two, terminal ethylenically unsaturated groups, and an actinically activable polymerization initiator or initiator combination. The photopolymerizable layer preferably has a basis weight of about 0.5 to 20 g/m$_2$.

Polymerizable compounds suitable for the purposes of the invention are known and described for example in U.S. Pat. Nos. 2,760,863 and 3,060,023.

Preferred examples are acrylic and methacrylic esters of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols or N-substituted acrylamides and methacrylamides. It is also advantageous to use reaction products of monoisocyanates or diisocyanates with partial esters of polyhydric alcohols. Such monomers are described in DE-A-2,064,079, -2,361,041 and -2,822,190.

Particular preference is given to polymerizable compounds which contain at least one photooxidizable group alone or together with one or more urethane groups in the molecule.

Suitable photooxidizable groups are in particular amino groups, urea groups, thio groups, which may also be the constituents of heterocyclic rings, and enol groups. Examples of such groups are triethanolamino, triphenylamino, thiourea, imidazole, oxazole, thiazole, acetylacetonyl, N-phenylglycine and ascorbic acid groups. Polymerizable compounds having primary, secondary and in particular tertiary amino groups are preferred.

Examples of compounds having photooxidizable groups are acrylic and alkacrylic esters of the formula I

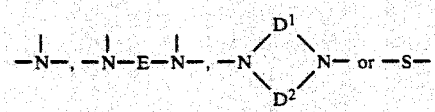

R is an alkyl, hydroxyalkyl or aryl group,
R$^1$ and R$^2$ are each a hydrogen atom, an alkyl group or an alkoxyalkyl group,
R$^3$ is a hydrogen atom or a methyl or ethyl group,
X is a saturated hydrocarbon group of 2 to 12 carbon atoms,
X is a (c+1)-valent saturated hydrocarbon group in which up to 5 methylene groups may have been replaced by oxygen atoms,
D$^1$ and D$^2$ are each a saturated hydrocarbon group of 1 to 5 carbon atoms,
E is a saturated hydrocarbon group of 2 to 12 carbon atoms, a cycloaliphatic group of 5 to 7 ring members which may contain up to two N, 0 or S atoms as ring members, an arylene group of 6 to 12 carbon atoms or a heterocyclic aromatic group of 5 or 6 ring members,
a is 0 or an integer from 1 to 4,
b is 0 or 1,
c is an integer from 1 to 3,
m is 2, 3 or 4, depending on the valence of Q, and
n is an integer from 1 to m,
with all the symbols of identical definition being identical to or different from one another.

The compounds of this formula, and the preparation and use thereof are described in detail in earlier German Patent Application P 37 10 279.6, corresponding to U.S. application No. 07/173,936.

If in the compound of the general formula I more than one radical R or more than one radical of the type indicated in square brackets is bonded to the central group Q, these radicals can be different from one another.

Compounds in which all the substituents of Q are polymerizable radicals, i.e. where m is n, are in general preferred.

In general, not more than one radical a is 0; preferably a is 1.

An alkyl or hydroxyalkyl group R generally has 2 to 8, preferably 2 to 4, carbon atoms. An aryl radical R can in general be monocyclic or bicyclic, preferably monocyclic, and may be substituted by alkyl or alkoxy groups of up to 5 carbon atoms or halogen atoms.

Alkyl and alkoxyalkyl groups R and R, can contain 1 to 5 carbon atoms.

R$^3$ is preferably a hydrogen atom or a methyl group, in particular a methyl group.

X$^1$ is preferably a straight-chain or branched aliphatic where
Q is

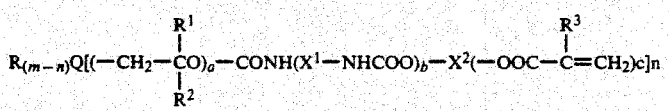

or cycloaliphatic radical of preferably 4 to 10 carbon atoms.

X$^2$ preferably has 2 to 15 carbon atoms, of which up to 5 may have been replaced by oxygen atoms. In the case of pure carbon chains, generally those having 2 to 12, preferably 2 to 6, carbon atoms are used. X$^2$ can also be a cycloaliphatic group of 5 to 10 carbon atoms, in particular a cyclohexylene group.

$D^1$ and $D^2$ can be identical or different, and together with the two nitrogen atoms form a saturated heterocyclic ring of 5 to 10, preferably 6, ring members.

An alkylene group E preferably has 2 to 6 carbon atoms, and an arylene group E is preferably a phenylene group. Preferred cycloaliphatic groups are cyclohexylene groups and preferred aromatic heterocycles are those having N or S as heteroatoms and 5 or 6 ring members.

The value of c is preferably 1.

The polymerizable compounds of the formula I which contain two urethane groups in every radical (b=1) are prepared by reacting acrylic or alkylacrylic esters which contain free hydroxyl groups in a conventional manner with the same molar amount of diisocyanates and reacting the excess isocyanate group with hydroxyalkylamines, N,N-bishydroxyalkylpiperazines or N,N,N',N'-tetrahydroxyalkylalkylenediamines, in each of which individual hydroxyalkyl groups may have been replaced by alkyl or aryl groups R. If a is 0, the result is a urea grouping.

Examples of the hydroxyalkylamine starting materials are triethanolamine, N-alkyl-N,N-di(hydroxyalkyl-)amines, diethanolamine, tris(2-hydroxypropyl)amine and tris(2-hydroxybutyl)amine.

Examples of diisocyanate starting materials are hexamethylene diisocyanate, 2,2,4-trimethylhexamethylene diisocyanate, 1,4-cyclohexylene diisocyanate and 1,1,3-trimethyl-3-isocyanatomethyl-5-isocyanatocyclohexane.

The hydroxyl-containing esters used are in particular hydroxyethyl methacrylate and hydroxypropyl methacrylate (n or iso) and the corresponding acrylates.

The polymerizable compounds of the formula I where b is 0 are prepared by reacting the above-described hydroxyalkylamino compounds with isocyanato-containing acrylic or alkylacrylic esters. An isocyanato-containing ester used in particular is isocyanatoethyl (meth)acrylate.

Further suitable compounds having photooxidizable groups are compounds of the formula

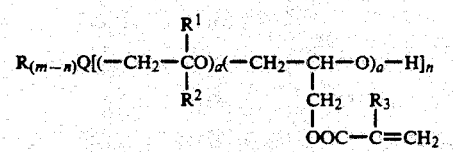

(II)

where Q, R, $R^1$, $R^2$, $R^3$, a, m and n are each as defined above and Q can additionally be a group

where E' is a group of the formula III

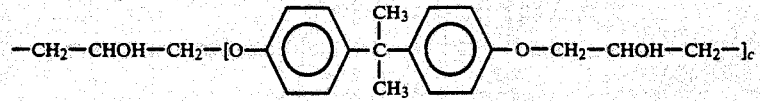

The compounds of the formula II are prepared similarly to those of the formula I, except that the hydroxyalkyl (alk)acrylates are replaced by the corresponding glycidyl (alk)acrylates.

The compounds of this formula and the preparation and use thereof are described in detail in earlier Patent Application P 37 38 864.9, corresponding to U.S. application Ser. No. 07/270,351.

Further suitable compounds having photooxidizable groups are acrylic and alkacrylic esters of the formula IV

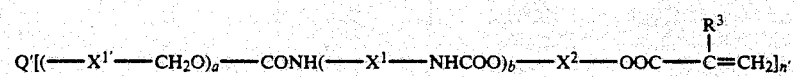

where
Q' is

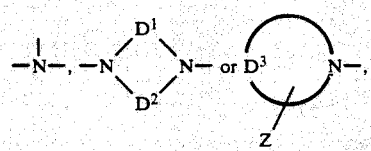

$X^1$ is $C_iH_{2i}$ or $C_iH_{2i-1}O$—CONH($-X^1$—NHCOO)$_b$—$X^2$—OOC—C=CH$_2$,

D3 is a saturated hydrocarbon group of 4 to 8 carbon atoms which together with the nitrogen atom forms a 5- or 6-membered ring, Z is a hydrogen atom or a radical of the formula

i and k are integers from 1 to 12, n' is 1, 2 or 3 depending on the valence of Q' and $R^3$, $X^1$, $X^2$, $D^1$, $D^2$, a and b are each as defined at the formula I, with all the symbols of identical definition being identical or different from one another and in at least one substituent on the group Q a being 0.

Of the compounds of the formula IV, those which contain at least one urethane group as well as a urea group are preferred. Urea groups are for the purposes of the present invention groups of the formula

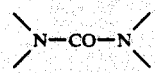

where the valences on the nitrogen are saturated by substituted or unsubstituted hydrocarbon radicals.

However, it is also possible for one valence on one nitrogen atom to be bonded to a further carbonylamide group (CONH), producing a biuret structure.

The symbol a in the formula IV is preferably 0 or 1; i is preferably a number from 2 to 10.

The polymerizable compounds of the formula IV are prepared in the same way as compounds of the formula I.

The compounds of the formula IV and the preparation thereof are described in detail in earlier German Patent Application P 38 24 903.0.

The proportion of photopolymerizable compound in the photopolymerizable layer is in general about 10 to 80, preferably 20 to 60, % by weight, based on the nonvolatile constituents.

Examples of usable binders are chlorinated polyethylene, chlorinated polypropylene, poly[alkyl (meth)acrylates] where the alkyl group is for example methyl, ethyl, n-butyl, i-butyl, n-hexyl or 2-ethylhexyl, copolymers of said alkyl (meth)acrylates with at least one monomer, such as acrylonitrile, vinyl chloride, vinylidene chloride, styrene or butadiene, polyvinyl chloride, vinyl chloride/acrylonitrile copolymers, polyvinylidene chloride, vinylidene chloride/acrylonitrile copolymers, polyvinyl acetate, polyvinyl alcohol, polyacrylonitrile, acrylonitrile/styrenecopolymers, acrylonitrile/butadiene/styrene/copolymers, polystyrene, polymethylstyrene, polyamides (for example nylon-6), polyurethanes, methylcellulose, ethylcellulose, acetylcellulose, polyvinyl/formal and polyvinyl butyral.

Of particular suitability are binders which are insoluble in water, soluble in organic solvents and soluble or at least swellable in aqueous alkaline solutions.

A special mention should be made of carboxyl-containing binders, for example copolymers of (meth)acrylic acid and/or unsaturated homologs thereof, such as crotonic acid, copolymers of maleic anhydride or monoesters thereof, reaction products of hydroxyl-containing polymers with dicarboxylic anhydrides, and mixtures thereof.

It is also possible to use reaction products of polymers which carry acidic H groups which have been wholly or partly reacted with activated isocyanates, for example reaction products of hydroxyl-containing polymers with aliphatic or aromatic sulfonyl isocyanates or phosphinoyl isocyanates.

Also suitable are: hydroxyl-containing polymers, for example copolymers of hydroxyalkyl (meth)acrylates, copolymers of allyl alcohol, copolymers of vinyl alcohol, polyurethanes or polyesters, and also epoxy resins, provided they carry a sufficient number of free OH groups, or have been modified in such a way that they are soluble in aqueous alkaline solutions, or those polymers which carry aromatically bonded hydroxyl groups, for example condensation products of condensable carbonyl compounds, in particular formaldehyde, acetaldehyde or acetone, with phenols or copolymers of hydroxystyrenes. Finally, it is also possible to use copolymers of (meth)acrylamide with alkyl (meth)acrylates.

The above-described polymers are suitable in particular when they have a molecular weight between about 500 and 200,000 or higher, preferably 1,000 to 100,000, and either acid numbers between 10 and 250, preferably 20 to 200 or hydroxyl numbers between 50 and 750, preferably 100 to 500.

Preferred alkali-soluble binders are: copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinylacetic acid with alkyl (meth)acrylates, copolymers of maleic anhydride with substituted or unsubstituted styrenes, unsaturated hydrocarbons, unsaturated ethers or esters, esterification products of copolymers of maleic anhydride, esterification products of hydroxyl-containing polymers with anhydrides of di- or polycarboxylic acids, copolymers of hydroxyalkyl (meth)acrylates with alkyl (meth)acrylates, (meth)acrylonitrile or the like, copolymers of allyl alcohol with substituted or unsubstituted styrenes, copolymers of vinyl alcohol with alkyl (meth)acrylates or other polymerizable unsaturated compounds, polyurethanes, provided they have a sufficient number of free OH groups, epoxy resins, polyesters, partially hydrolyzed vinyl acetate copolymers, polyvinyl acetals having free OH groups, copolymers of hydroxystyrenes with alkyl (meth)acrylates or the like, phenol-formaldehyde resins, for example novolaks.

The amount of binder in the light-sensitive layer is in general about 20 to 90, preferably 40 to 80, % by weight.

The photoinitiators used can be a large number of substances. Examples are those which are derived from the basic skeleton of benzophenones, acetophenones, benzoins, benzils, benzil monoketals, fluorenone, thioxanthone, polycyclic quinones, acridines and quinazolines, and also trichloromethyl -s-triazines, 2-halomethyl-5-vinyl-1,3,4-oxadiazole derivatives, trichloromethyl-substituted halooxazoles or trihalomethyl-containing carbonylmethylene heterocycles as described in DE-A-3,333,450.

Preferred photoinitiators are photoreducible dyes, in particular if combined with radiation-cleavable trihalomethyl compounds and perhaps with acridine, phenazine or quinoxaline photoinitiator compounds as described in earlier German Patent Applications P 37 10 281.8, corresponding to U.S. application No. 07/173,559, and P 37 10 282.6, corresponding to U.S. application No. 07/174,426.

Suitable photoreducible dyes are in particular xanthene, benzoxanthene, benzothioxanthene, thiazine, pyronine, porphyrine and acridine dyes. The amount of dye is in general between about 0.01 and 10, preferably between 0.05 and 4, % by weight, based on the nonvolatile constituents of the layer.

To increase the light sensitivity, layers may have added to them compounds having photolytically cleavable trihalomethyl groups which are known per se for use as free radical-forming photoinitiators for photopolymerizable mixtures. Proven coinitiators of this type are in particular compounds containing chlorine and bromine, in particular chlorine, as halogens. The trihalomethyl groups can be bonded directly or via a fully conjugated chain to an aromatic carbocyclic or heterocyclic ring. Preference is given to compounds having a triazine ring in the basic skeleton which preferably carries 2 trihalomethyl groups, in particular to those described in EP-A-137,452, DE-A-2,718,259 and DE-A-2,243,621. These compounds are strongly absorbing in the near UV, for example around 350–400 nm. It is also possible to use coinitiators which themselves show little if any absorption in the spectral region of the copying light, such as trihalomethyltriazines which contain substituents having comparatively short mesomerization-capable electron systems or aliphatic substituents. It is also possible to use compounds having a different basic structure which absorb in the shorter-wave UV region, for example phenyl trihalomethyl sulfones or phenyl trihalomethyl ketones, for example phenyl tribromomethyl sulfone.

These components are in general only used in an amount of 0.01 to 10, preferably 0.05 to 6, % by weight, based on the nonvolatile constituents of the layer.

The materials according to the invention preferably contain as a further initiator constituent an acridine, phenazine or quinoxaline compound. These compounds are known for use as photoinitiators and are described in DE-C-2,027,467 and -2,039,861. These compounds increase the sensitivity of the mixture in particular in the near ultraviolet region. The amount of this component is likewise within the range from about 0.01 to 10% by weight, preferably between 0.05 and 5% by weight.

If a further increase in the sensitivity in the visible region of the spectrum is desired, it can be brought about by adding a compound of the dibenzalacetone or coumarin type. This addition gives a more highly resolved copy and complete sensitization of the mixture to the visible region of the spectrum up to wavelengths of about 600 nm. The amount of this compound is likewise within the range from about 0.01 to 10, preferably from 0.05 to 4, % by weight.

The total amount of polymerization initiator is in general about 0.05 to 20, preferably 0.1 to 10, % by weight.

The photopolymerizable layers may contain various substances as additives depending on the intended use and the desired properties. Examples are: inhibitors for preventing thermal polymerization of the monomers, hydrogen donors, dyes, colored and uncolored pigments, dye-forming components, indicators, plasticizers and chain transfer agents. These constituents are usefully selected in such a way that they absorb as little as possible of the actinic radiation important for the process of initiation.

For the purposes of the present invention, actinic radiation is any radiation whose energy is at least equal to that of visible light. It is possible to use in particular visible light and long-wave UV radiation, but also short-wave UV radiation, laser light, electron beams and X-rays. The light sensitivity ranges from about 200 nm to 800 nm and hence covers a very wide range.

Suitable applications for the material according to the invention are: recording layers for the photomechanical production of printing plates for letterpress printing, planographic printing, intaglio printing and screen printing, relief copies, for example production of texts in braille, individual copies, tanned images, pigment images, etc. The mixtures can also be used for the photomechanical production of discharge resists, for example for fabricating name tags, copied circuits and chemical milling. The mixtures according to the invention are particularly important as recording layers for the production of planographic printing plates and for photoresist technology.

Suitable base materials for the recording material according to the invention are for example aluminum, steel, zinc and copper foils, plastics films, for example polyethylene terephthalate or cellulose acetate films, and screen printing materials, such as Perlon gauze. It is in many cases advantageous to subject the surface of the base material to a pretreatment (chemical or mechanical) with the aim of correctly adjusting the adhesion of the layer, improving the lithographic properties of the surface of the base material, or reducing the reflectivity of the base material in the actinic region of the copying layer (antihalation protection).

The light-sensitive materials are fabricated in a conventional manner. For instance, it is possible to take up the layer constituents in a solvent, to apply the solution or dispersion to the intended base material by casting, spraying, dipping, roller coating and the like, and then to dry.

Owing to the broad spectral sensitivity of the recording material according to the invention, it is possible to use any light source familiar to those skilled in the art, for example fluorescent tubes, pulsed xenon lamps, metal-halide-doped high-pressure mercury vapor lamps and carbon arc lamps. In addition, it is possible to irradiate the light-sensitive mixtures according to the invention in conventional protection and magnification equipment with the light from metal filament lamps and by contact exposure with customary incandescent lamps. Irradiation can also be effected with the coherent light of a laser. Suitable for the purposes of the present invention are lasers of the right power, for example argon ion, krypton ion, dye, helium-cadmium and helium-neon lasers, which emit in particular in the range from 250 to 650 nm. The laser beam can be controlled by means of a preprogrammed line and/or scanning movement.

The materials are further processed in a conventional manner. To effect better crosslinking in the layer, it is possible to heat after exposure. To develop them, they are treated with a suitable developer solution, for example with organic solvents, but preferably with a weakly alkaline aqueous solution, which serves to remove the unexposed areas of the layer, leaving behind the exposed areas of the copying layer on the base material. The developer solutions may contain a small amount, preferably less than 5% by weight, of water-miscible organic solvents. They may further contain wetting agents, dyes, salts and other additions. In the course of development, the entire cover layer is removed together with the unexposed areas of the photopolymerizable layer.

In what follows, the invention is described with reference to illustrative embodiments. Parts by weight bear the same relation to parts by volume as the g to the ccm. Percentages and mixing ratios are by weight, unless otherwise stated.

EXAMPLE 1 (COMPARATIVE EXAMPLE)

The base material used for printing plates was electrochemically roughened and anodized aluminum which had an oxide layer of 3 $g/m^2$ and had been pretreated with an aqueous solution of polyvinylphosphonic acid. The base material was coated with a solution of the following composition:

2.84 parts by weight of a 22.3% strength solution of a terpolymer of styrene, n-hexyl methacrylate and methacrylic acid (10:60:30) of acid number 190 in methyl ethyl ketone, 1.49 parts by weight of the reaction product of triethanolamine with 3 moles of isocyanatoethyl methacrylate, 0.04 part by weight of eosin alcohol-soluble (C.I. 45 386), 0.03 part by weight of 2,4-bistrichloromethyl-6-(4-styrylphenyl)-s-triazine and 0.049 part by weight of 9-phenylacridine in 22 parts by weight of propylene glycol monoethyl ether.

Application was by spincoating in such a way that a dry weight of 2.8 to 3 g/m² was obtained. The plate was then dried at 100° C. in a through-circulation cabinet for two minutes. The plate was then coated with a 15% strength aqueous solution of polyvinyl alcohol (12% of residual acetyl groups, K value 4). Drying left a cover layer having a weight of 4 to 5 g/m². The printing plate obtained was irradiated with a 5 kW metal halide lamp at a distance of 110 cm under a 13-step irradiation wedge with density increments of 0.15 onto which, as far as indicated, in addition a silver film of uniform blacking (density 1.57) and uniform absorption across the entire spectrum was mounted as a gray filter. To test the sensitivity of the printing plate in visible light, 3 mm thick edge filters from Schott having the edge transmissibilities indicated in the table were mounted on the irradiation wedge. Following irradiation, the plate was heated at 100° C. for one minute. It was then developed in a developer of the following composition:

120 parts by weight of sodium metasilicate. 9 H₂O,
2.13 parts by weight of strontium chloride,
1.2 parts by weight of non-ionic wetting agent (cocoa fatty alcohol polyoxyethylene ether containing about 8 ethyleneoxy units) and
0.12 part by weight of antifoam agent in
4,000 parts by weight of fully demineralized water.

The plate was inked with a greasy printing ink. The fully crosslinked wedge steps indicated below were obtained. The resolving power of the printing plate was determined with a test original, the PMS wedge (FOGRA), and read off on the copy.

| Irradiation (seconds) | Gray filter | Edge filter | Wedge steps | Resolution (μm) |
|---|---|---|---|---|
| 10 | yes | — | 11 | 25 |
| 10 | no | 455 | 9 | 25 |

The printed plate was tested in respect of its shelflife. To this end, samples thereof were stored at 80° C. in a through-circulation cabinet for several hours. Following the times indicated in Table I they were irradiated and developed as described above. The following numbers of fully crosslinked wedge steps were obtained under the edge filter 455 nm:

TABLE I

| Storage tes at 80° C. | | |
|---|---|---|
| Hours | Irradiation (seconds) | Fully crosslinked wedge steps |
| 0 | 10 | 9 |
| 0.5 | 10 | 8 |
| 1 | 10 | 7 |
| 2 | 10 | 6 |
| 3 | 10 | 2* |
| 4 | 20 | — |

— no crosslinking/*plate not tone-free

EXAMPLES 2 TO 8

The base material and the photopolymer layer of Example 1 were covered with oxygen-inhibiting layers in a dry layer weight of about 2 g/m² from the following solutions:

100 parts by weight of a 7% strength aqueous solution of polyvinyl alcohol (12% of residual acetyl groups, K value 4, i.e. viscosity of a 4% strength aqueous solution at 20° C.: 4.0 mPa.s)
0.4 part by weight of polymer as per Table II

TABLE II

| Example No. | Polymer | Viscosity by Brookfield (mPa · s) | Molecular weight | Tradename/manufacturer |
|---|---|---|---|---|
| 2 | PEI | 17,000–28,000 | | Polymin P (BASF) |
| 3 | " | 500–1,000 | | Polymin SK (BASF) |
| 4 | " | 450–1,500 | | Polymin SR (BASF) |
| 5 | " | 400–900 | | Polymin RN (BASF) |
| 6 | " | | 60,000 | Corcat P600 (Virginia Chemicals) |
| 7 | " | | 1,800 | Corcat P18* (BASF) |
| 8 | " | | 1,200 | Corcat P12* (BASF) |

PEI = polyethyleneimine
* = Chemical Abstracts registry number CAS 9002-98-6

The printing plates were processed as described in Example 1. The fully crosslinked wedge steps indicated in the table below were obtained under the edge filter 455 nm in the course of an irradiation time of 10 seconds and following storage in a through-circulation cabinet at 80° C.

TABLE III

| | Storage test at 80° C. | | | | | |
|---|---|---|---|---|---|---|
| | Storage time (hours) | | | | | |
| Example No. | 0 | 0.5 | 1 | 2 | 3 | 4 |
| 2 | 8 | 8 | 8 | 8 | 8 | 8 |
| 3 | 7 | 7 | 7 | 7 | 7 | 7 |
| 4 | 7 | 7 | 7 | 7 | 7 | 7 |
| 5 | 7 | 7 | 7 | 7 | 7 | 7 |
| 6 | 7 | 6 | 6 | 6 | 6 | 5 |
| 7 | 7 | 6 | 6 | 6 | 5 | 5 |
| 8 | 7 | 6 | 6 | 5 | 4 | 3 |

EXAMPLE 9

The base material and the photopolymer layer of Example 1 were covered with an oxygen-inhibiting layer in a dry weight of about 2 g/m² from the following solution:

100 parts by weight of a 7% strength aqueous solution of polyvinyl alcohol (12% of residual acetyl groups, K value 8)
0.4 part by weight of polyethyleneimine (Polymin P)

This printing plate was subjected to a storage test at 100° C. Following 10 seconds' irradiation under the edge filter 455 nm and development as described in Example 1, the fully crosslinked wedge steps indicated in the following table were obtained:

TABLE IV

| Storage test at 100° C. | |
|---|---|
| Hours | Wedge steps |
| 0 | 7 |
| 1 | 7 |
| 2 | 7 |
| 3 | 6 |
| 4 | 5 |

EXAMPLES 10 AND 11

The base material indicated in Example 1 was spincoated under the same conditions as indicated there with a solution of the following composition in such a way as to produce a layer weight of 2 g/m²:

4.0 parts by weight of a 34.8% strength solution of a copolymer of methyl methacrylate and methacrylic acid having an acid number of 110 and an average molecular weight of 35,000 in 2-butanone, 2.8 parts by weight of the reaction product of triethanolamine with 3 moles of glycidyl methacrylate, 0.04 part by weight of eosin (alcohol-soluble) C.I. 45386, 3 part by weight of 2, 4-bistrichloromethyl-6-(4-styrlphenyl)-s-triazine and 0.049 part by weight of 9-phenylacridine in 22.0 parts by weight of propylene glycol monomethyl ether.

This plate was covered on the one hand with the cover layer of Example 9 in a layer weight of 2 g/m² (Example 10) and for comparison with the cover layer of Example 1 in the same thickness (Example 11). The two plates were subjected to a long-term storage test at 53° C. The results given in Table V were obtained. The printing plates were irradiated for 10 seconds under the edge filter 455 nm and developed as described in Example 1.

TABLE V

| Storage time days | Storage test at 53° C. Fully crosslinked wedge steps | |
|---|---|---|
| | Example 10 | Example 11 (V) |
| 1 | 6 | 5 |
| 2 | 6 | 4 |
| 3 | 6 | 2* |
| 6 | 6 | — |
| 9 | 5 | — |
| 18 | 4 | — |

— no crosslinking/*plate not tone-free

It is evident that the printing plate having polyethyleneimine in the cover layer has a significantly longer shelf life. The inhibiting effect of the cover layer on oxygen is much improved even over prolonged periods.

EXAMPLES 12 TO 14

The base material and the photopolymer layer of Example 1 were covered with the oxygen-inhibiting cover layers listed in Table VI in a dry layer weight of about 2 g/m² from the following solution:

100 parts by weight of polyvinyl alcohol solutions as in Example 2, x parts by weight of polyethyleneimine (Polymin P) as in Table VI.

TABLE VI

| Example No. | Parts by weight of Polymin P |
|---|---|
| 12 | 0.8 |
| 13 | 1.2 |
| 14 | 1.6 |

These printing plates were subjected to a storage test at 80° C. Following 10 seconds' irradiation under the edge filter 455 nm and development as indicated in Example 1, the fully crosslinked wedge steps indicated in Table VII were obtained.

TABLE VII

| Example No. | Storage test at 80° C. Storage time (hours) | | | | | |
|---|---|---|---|---|---|---|
| | 0 | 0.5 | 1 | 2 | 3 | 4 |
| 12 | 8 | 8 | 8 | 8 | 8 | 8 |
| 13 | 8 | 8 | 8 | 8 | 8 | 8 |
| 14 | 8 | 8 | 8 | 8 | 8 | 8 |

What is claimed is:

1. A photopolymerizable planographic printing plate which comprises:
   (a) a base material having a hydrophilic surface suitable for planographic printing;
   (b) a photopolymerizable layer having a layer weight of about 0.5 to 20 g/m² and comprising (1) a polymeric binder, (2) a free-radical-polymerizable compound comprising at least one photooxidizable group and having at least one terminal ethylenically unsaturated group, and (3) a polymerization initiator comprising a photoreducible dye and activatable by actinic radiation; and
   (c) a cover layer comprising (a) a water soluble polymer which is substantially impermeable to oxygen and (b) a polymer which binds oxygen and is soluble in water at 20° C.

2. A photopolymerizable recording material which comprises:
   (a) a base material;
   (b) a photopolymerizable layer having a layer weight of about 0.5 to 20 g/m² and comprising (1) a polymeric binder, (2) a free-radical-polymerizable compound comprising at least one photooxidizable group and having at least one terminal ethylenically unsaturated group, and (3) a polymerization initiator comprising a photoreducible dye and activatable by actinic radiation; and
   (c) a cover layer comprising (1) a water soluble polymer which is substantially impermeable to oxygen and (2) a polymer which binds oxygen and is soluble in water at 20 degrees Celsius.

3. The printing plate as claimed in claim 1, wherein said free-radical-polymerizable compound has at least two terminal ethylenically unsaturated groups.

4. The recording material as claimed in claim 2, wherein said free-radical-polymerizable compound has at least two terminal ethylenically unsaturated groups.

5. The recording material as claimed in claim 2, wherein the cover layer has an oxygen permeability of less than 30 cm³/m²/d/bar at 20° C.

6. The recording material as claimed in claim 2, wherein the polymer which binds oxygen comprises a plurality of aliphatic amino groups.

7. The recording material as claimed in claim 6, wherein the polymer comprising aliphatic amino groups is a polyalkyleneimine.

8. The recording material as claimed in claim 7, wherein the polyalkyleneimine is a polyethyleneimine or a polypropyleneimine.

9. The recording material as claimed in claim 2, wherein the cover layer has a basis weight of about 0.5 to 10 g/m².

10. The recording material as claimed in claim 2, wherein the polymer which binds oxygen has a molecular weight of about 300 to 1,000,000.

11. The recording material as claimed in claim 2, wherein the polymer which is substantially impermeable to oxygen is a polyvinyl alcohol or a partially hydrolyzed polyvinyl acetate.

12. The recording material as claimed in claim 2, wherein the cover layer comprises about 40 to 97% by weight of polymer (a) and about 3 to 60% by weight of polymer (b).

13. The recording material as claimed in claim 2, wherein the cover layer further comprises a surface-active agent.

14. The recording material claimed as in claim 2, wherein the polymerizable compound further comprises at least one urethane group.

15. The recording material as claimed in claim 2, wherein the binder is water-insoluble and soluble in aqueous alkaline solutions.

16. The recording material as claimed in claim 2, wherein the base material has a hydrophilic surface suitable for planographic printing.

* * * * *